United States Patent [19]

Dumas

[11] 4,038,111

[45] July 26, 1977

[54] METHOD FOR DIFFUSION OF ALUMINIUM

[75] Inventor: Guy Henri Dumas, Paris, France

[73] Assignee: Silec-Semi-Conducteurs, Paris, France

[21] Appl. No.: 595,751

[22] Filed: July 14, 1975

[30] Foreign Application Priority Data

Aug. 1, 1974 France .............................. 74.26821

[51] Int. Cl.$^2$ ..................................... H01L 21/225
[52] U.S. Cl. .................................... 148/188; 148/186; 148/190; 427/85
[58] Field of Search ................. 148/188, 189, 186, 190

[56] References Cited

U.S. PATENT DOCUMENTS

| 3,354,005 | 11/1967 | Lepiane et al. | 148/186 |
| 3,615,943 | 10/1971 | Genser | 148/186 X |
| 3,630,793 | 12/1971 | Christensen et al. | 148/188 |
| 3,660,156 | 5/1972 | Schmidt | 148/188 X |
| 3,697,334 | 10/1972 | Yamamoto et al. | 148/187 X |
| 3,789,023 | 1/1974 | Ritchie | 148/188 X |
| 3,928,095 | 12/1975 | Harigaya | 148/188 |

Primary Examiner—G. Ozaki
Attorney, Agent, or Firm—Cushman, Darby & Cushman

[57] ABSTRACT

The invention relates to a method for diffusing aluminium into a substrate by painting. According to this method, aluminium isopropylate is dissolved in ethoxyethanol at the maximum solubility. This solution is uniformly coated onto a substrate and a diffusion is carried out by placing this coated substrate into an open furnace. This invention is for manufacturing high voltage semiconductor devices.

9 Claims, 2 Drawing Figures

METHOD FOR DIFFUSION OF ALUMINIUM

FIELD OF THE INVENTION

The invention relates to a process for manufacturing semiconductors comprising at least one layer doped with aluminium and it also relates to the new products obtained with such a process.

DESCRIPTION OF THE PRIOR ART

It is known in the semiconductor technology that among P-type doping agents such as aluminum, boron, gallium and indium, aluminium presents the typical advantage of providing, together with a N-type substrate, such as silicon, junctions which can withstand very high voltages. However, aluminium is not much used in the semiconductor technology as it brings in many practical problems. The aluminium oxide or alumina $Al_2O_3$, is a material that can hardly be dissociated and hence cannot be easily used as a diffusion source. Consequently, the aluminium diffusions had to be made in sealed tubes to prevent the oxidation of aluminium; but, there arises the second disadvantage that in the common sealed tube methods the housings commonly used are made of quartz and alumina reacts with quartz according to the well known formula:

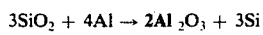

$$3SiO_2 + 4Al \rightarrow 2Al_2O_3 + 3Si$$

It results therefrom that the vapor pressure of aluminium in the presence of quartz is lower than the vapor pressure of aluminium that could be expected at the processing temperature. Thus, in using conventional sealed tube methods in a quartz housing, the surface concentration of aluminium ($C_{SAl}$) is not substantially higher than $10^{16}$ atoms/cc.

In addition, in this basic process there occurs, above the zone where aluminium has been diffused, a zone of N-type diffusion caused by the quartz contamination. Thus as disclosed especially in "Diffusion of Aluminium in Single Crystal silicon" by R. C. Miller and A. Savage — Journal of Applied Physics, vol. 7, No 12, Dec. 1956 or in "On the diffusion of Aluminium into Silicon" by Y. C. Kao — Electrochemical Technology, Vol. 3–4, March-April 1967, and in other documents, it is necessary to use various relatively complex techniques to obtain diffusions of aluminium into a substrate with relatively high surface concentrations (above $10^{17}$ at/cc).

SUMMARY OF THE INVENTION

Therefore, an object of the invention is to provide a specific mixture containing an aluminium compound which dissociates to provide aluminium, enabling to carry out a diffusion into a silicon substrate by the painting process.

Another object of the invention is to provide a mixture comprising aluminium compatible with a mixture comprising another dopant so as to obtain a compound mixture that can be coated in a single application onto a substrate in order to obtain a simultaneous diffusion of aluminium and the other dopant by painting.

A further object of the invention is to provide a mask compatible with the above methods in order to obtain localized diffusions of aluminium.

To achieve these objects, and others, the present invention contemplates to carry out an aluminium diffusion by painting with a mixture comprising a solution or suspension of an organic aluminium compound into a liquid which can be of the alkoxy-alkanol type. This compound can be of the $AlR_3$ type where the radical R is an alkoxy or a diacid radical. The present invention also contemplates to combine this mixture with another mixture into a liquid identical to the first one or compatible therewith comprising a compound of another doping agent in order to obtain simultaneous diffusions of the homopolar or heteropolar type by painting.

In addition, the invention contemplates the utilization of a silica mask coated with polycrystal silicon to enable to carry out localized diffusions of aluminium into a substrate.

BRIEF DESCRIPTION OF THE DRAWINGS

These and other objects will become more apparent from the following description and drawings.

DESCRIPTION OF THE PREFERRED EMBODIMENTS

It will be now recalled that the painting method consists, as well known in the art, in the following steps: depositing onto the surface of a substrate a solution or a suspension of a compound comprising a doping agent; evaporating or eliminating the solvent; and placing the substrate coated with the compound comprising the doping agent into a furnace at a high temperature, the magnitude of the temperature and the processing time duration defining the various parameters of the desired diffused layer.

According to the invention the aluminium compound which forms, when dissociated, aluminium and not alumina, is an organic aluminium compound such as $AlR_3$ compounds wherein the radical R can be an alkoxy group and preferentially a $C_{1-8}$ alkyl group.

This compound will be dissolved at the maximum solubility or suspended in a solvent which, for example, can be of the alkoxyalkanol type, having the formula $R'-R''-OH$, the alkoxy group $R'$ having about 1 to 5 carbon atoms and the alkylene group having also about 1 to 5 carbon atoms.

For example a preferred organic aluminium compound is the aluminium isopropoxide

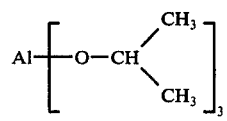

and other suitable compounds are diethylaluminum malonate $Al[C_7H_{11}O_4]_3$ and . . . triethoxyaluminium which are solid at ambient temperature.

In a preferred embodiment an aluminium isopropoxide solution has been dissolved at the maximum solubility in ethoxyethanol, i.e. a solubility of about 0.03g/cubic centimeter. Thereupon this solution has been deposited with a dropper onto a wafer of a silicon substrate, the distribution of the solution on the wafer being made by centrifugation at a preferred rotational speed of 3000 rpm. It will be appreciated that this rotational speed is critical and varies according to the viscosity of the mixture. In order to increase this viscosity, glycol and especially ethylene glycol ($C_2H_6O_2$) is added to the solution, one part of ethylene glycol being added to four parts of the solution. Thereupon, the solvent is eliminated by heating at a temperature higher than 300° C. Then the diffusion itself is carried out in an open tube in a neutral or oxidizing gazeous atmosphere according to well known methods.

Figure 1:
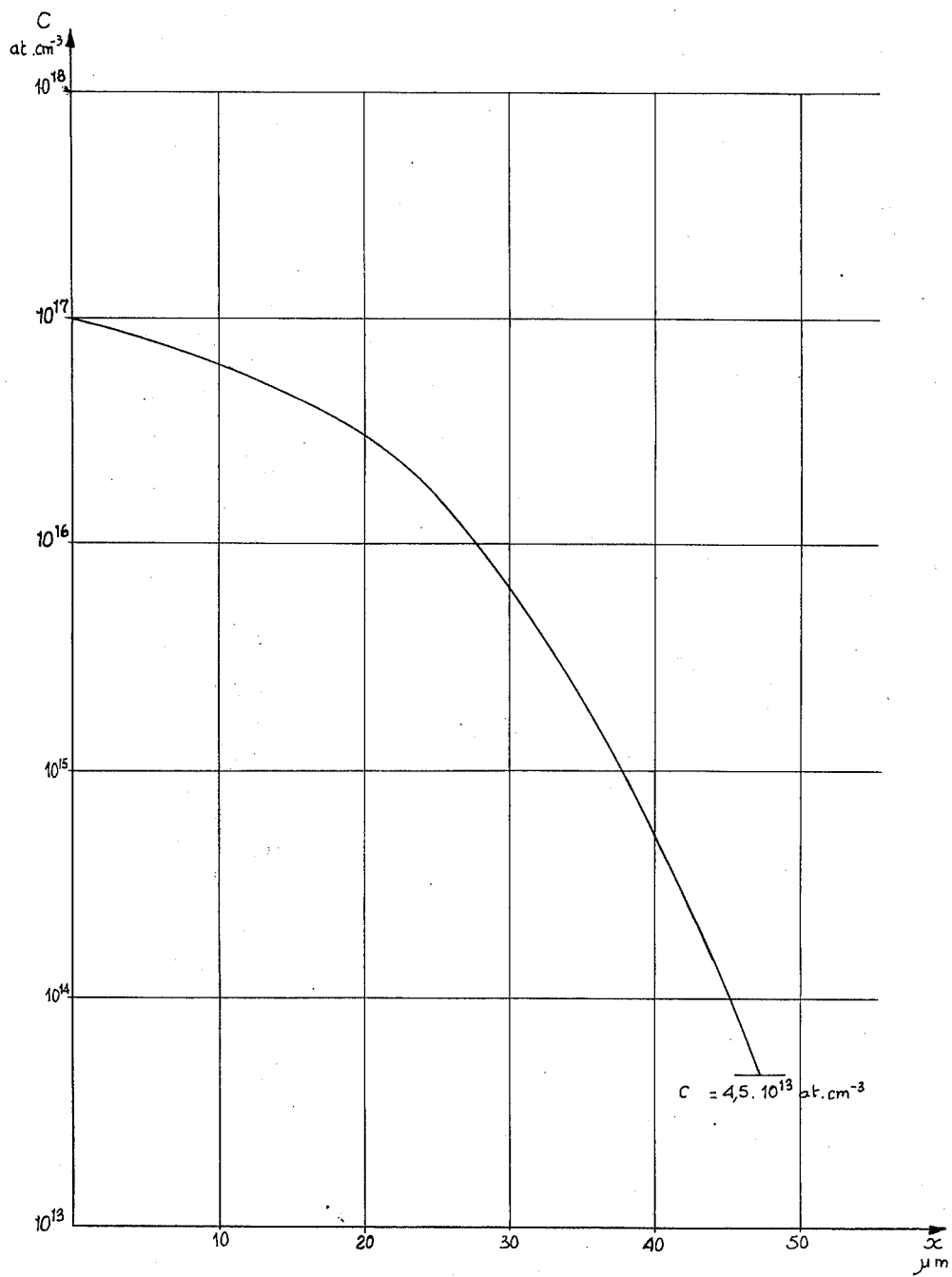
FIG. 1 is an exemplary graph showing the concentration of aluminium ($C_{(x)}$) in atoms per cubic centimeter versus the depth of penetration of the aluminium into a substrate.

FIG. 1 shows the profile of the aluminium diffusion, the painting layer being prepared as explained previously and the diffusion being made during a three hour period of time and at 1300° C. On the y-axis $C_{(x)}$ is the concentration of aluminium in atoms per cubic centimeter and on the x-axis x is the depth in microns from the substrate surface. As it is apparent, a surface concentration $C_s$ of about $10^{17}$ atoms per cubic centimeter is obtained and the diffusion factor which can be calculated is about $7.8 \times 10^{11} cm^2/$second, the overall diffusion depth being about 50 microns.

According to another aspect of the invention an advantage of the method previously described is that it permits one to carry out simply simultaneous diffusions of distinct doping agents. In fact as previously mentioned the aluminium presents the advantage of providing junctions that withstand very high voltages but it has the disadvantage that the surface concentration value is generally low, while it is admitted that, in order to obtain a good ohmic contact with an electrode, it is necessary that the surface concentrations of doping agents reach values in the range of $10^{19}$ atoms per cubic centimeter or more. Thus, for example in case it is desired to simply produce a diode it is necessary to provide a second doping agent of the same type as aluminium that is of the P-type above the aluminium layer doped in order to ensure the ohmic contact.

The above disclosed painting method has the general advantage that simultaneous diffusions can be carried out by providing successive coatings by painting of the aluminium based mixture described hereabove and of a mixture comprising another doping agent of the same type or of the opposed type (homopolar or heteropolar simultaneous diffusion).

Further it has to be noted that due to the high diffusion factor of the aluminium it will be possible in most cases to obtain a deep aluminium diffusion and a diffusion of another doping agent at the surface of the substrate only. The method which consists in providing a first coating of an aluminium mixture onto the substrate, then of a mixture comprising another doping agent presents the obvious drawbacks to be a two-step method necessitating two successive drying steps and additional cleaning steps between the two successive coating steps. An advantage of the previously described aluminium mixture is that the mentioned solvents and especially ethoxyethanol are also solvents (or liquids to be used for suspensions) for other compounds of doping agents usable for the methods wherein painting is employed.

Figure 2:
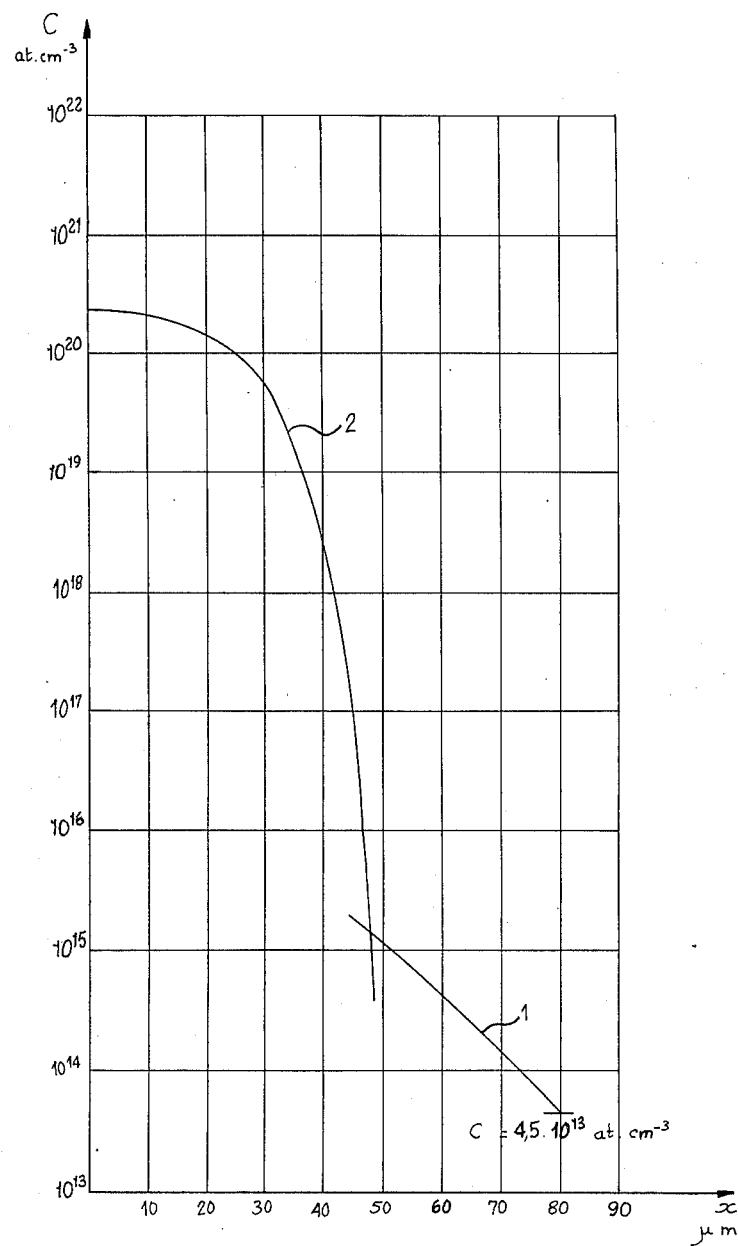
FIG. 2 is an exemplary graph showing the concentration of aluminium ($C_{(x)}$) and of another doping agent in atoms per cubic centimeter versus their depth of penetration into a substrate.

Referring now to FIG. 2 a preferred embodiment of the simultaneous diffusion will be described wherein the second doping is boron (of the P-type as aluminium). A boron oxide ($B_2O_3$) suspension is made in ethoxyethanol the parts being as follows: 50 $cm^3$ of ethoxyethanol and from 1 to 20 g of boron oxide $B_2O_3$. Thereafter, equal volumes of boron mixture and aluminium mixture are put together and this overall mixture is deposited onto the silicon substrate. In FIG. 2, the curves show the concentration of the doping agent in atoms/cc versus the penetration depth x in microns. The curve 1 shows the aluminium concentration and the curve 2 the boron concentration. It will be noted that for a diffusion time of 18 hours at a temperature of 1250° C, a region doped with aluminium is obtained ranging from 50 to 80 microns and a region doped with boron and aluminium between the surface and a depth of 50 microns is obtained, the surface concentration in P-type doping agent being about $3 \times 10^{20}$ atoms/cc, the diffusion factors of aluminium and boron being $D_{Al} 1 = 3 \times 10^{-11} cm^2/s$; and $D_B = 1.1 \times 10^{-11} cm^2/s$, respectively.

In the prior art, silicon nitride $Si_3N_4$ has been utilized for masking and for providing localized diffusions of aluminium into a substrate as described especially in "The Preparation and Properties of Amorphus Silicon Nitride Films" by Q. Lee and Gruber, published in the Journal of Electrochemical Society (Solid State Science) of July 1967, Vol. 114, No. 7. The inventor has observed that in the particular case of the method by painting as described previously this mask is ineffective due to the relatively high temperatures (for example 1250° C). Similarly, silica which is the most commonly used mask reacts with aluminium.

Consequently, a third aspect of the present invention is that after thorough investigations the inventor has observed during experiments that a mask of silica coated with polycrystal silicon enables the aluminium diffusion process to be efficiently stopped. It has thus been observed that in carrying out the diffusion of aluminium according to the above method at 1240° C, during 14½ hours, a silica layer having a thickness of 1.5 microns does not completely block the aluminum diffusion into the substrate. The aluminum diffusion is blocked by a silica layer having a thickness of 0.6 microns overcoated with a 4 micron thick polycrystalline silicon layer.

While the invention has been described in conjunction with specific embodiments thereof it is evident that many alternatives, modifications and variations will be apparent to those skilled in the art.

What is claimed is:

1. A method of diffusing aluminium onto a semiconductor substrate comprising the steps of painting onto a semiconductor substrate a diffusable aluminium source comprising an organic aluminium compound:

$$Al\ R_3$$

wherein $R_3$ is a $C_1 - C_8$ alkoxy group dissolved in a liquid composed of an alkoxyalkanol:

$$R' - R''OH$$

wherein the alkoxy group R' has from 1 to 5 carbon atoms and the alkylene group R" has 1 to 5 carbon atoms;

and thereafter heating the painted substrate diffusing the aluminium metal into the substrate.

2. A method as in claim 1 wherein the mixture further comprises a glycol in order to increase its viscosity.

3. A method as in claim 1 wherein the organic aluminium compound is aluminium isopropoxide.

4. A method as in claim 1 wherein the alkoxyalkanol is ethoxyethanol.

5. A method for diffusing simultaneously aluminium and another doping agent wherein the aluminium source is prepared according to claim 1 and wherein a source of another dopant comprising also a mixture including a compound of this dopant is deposited over the layer acting as the aluminium source.

6. A method for diffusing simultaneously by painting two doping agents wherein the aluminium source according to claim 1 is mixed prior to its application onto the substrate with a source of another dopant.

7. A method as in claim 6 wherein the other dopant is boron and wherein the compound of the other dopant is boron oxide $B_2O_3$ and wherein this compound $B_2O_3$ is in suspension in ethoxyethanol.

8. A method as in claim 1 for effecting localized diffusion of aluminium further comprising the step of providing a masking layer made from silica coated with polycrystalline silicon.

9. A method of diffusing aluminium onto a semiconductor substrate comprising the steps of applying to said substrate a diffusable aluminium source coating consisting essentially of aluminium isopropoxide substantially dissolved in ethoxyethanol and glycol to increase viscosity of the coating; evaporating the solvent; and thereafter heating the thus coated substrate diffusing aluminium metal into the substrate.

* * * * *